US012636669B2

(12) United States Patent
Kim et al.

(10) Patent No.: US 12,636,669 B2
(45) Date of Patent: May 26, 2026

(54) LIQUID SUPPLY UNIT AND SUBSTRATE TREATING APPARATUS

(71) Applicant: SEMES CO., LTD., Cheonan-si (KR)

(72) Inventors: Soon Hyun Kim, Cheonan-si (KR); Kyung Min Kim, Cheonan-si (KR)

(73) Assignee: Semes Co., LTD., Cheonan-si (KR)

( * ) Notice: Subject to any disclaimer, the term of this patent is extended or adjusted under 35 U.S.C. 154(b) by 399 days.

(21) Appl. No.: 18/343,242

(22) Filed: Jun. 28, 2023

(65) Prior Publication Data

US 2024/0216939 A1 Jul. 4, 2024

(30) Foreign Application Priority Data

Dec. 29, 2022 (KR) ........................ 10-2022-0188491

(51) Int. Cl.
B05B 13/04 (2006.01)
B05B 13/02 (2006.01)
(Continued)

(52) U.S. Cl.
CPC ...... B05B 13/0421 (2013.01); H10P 72/0414 (2026.01); H10P 72/0424 (2026.01)

(58) Field of Classification Search
None
See application file for complete search history.

(56) References Cited

U.S. PATENT DOCUMENTS

2007/0072092 A1* 3/2007 Shimoaoki .......... H01L 21/6715
430/5
2009/0095325 A1* 4/2009 Choi ................... H01L 21/6875
134/104.1
(Continued)

FOREIGN PATENT DOCUMENTS

JP       H08257466 A  * 10/1996
KR    10-2008-0082152 A     9/2008
(Continued)

OTHER PUBLICATIONS

Machine Generated English Translation of the description KR 20100000292 held to Kim Kyung Hee. (Year: 2010).*
(Continued)

*Primary Examiner* — Sylvia MacArthur
(74) *Attorney, Agent, or Firm* — Harness, Dickey & Pierce, P.L.C.

(57) ABSTRACT

The inventive concept provides a liquid supply unit which may implement a rotation (swing) of a plurality of nozzles by a single motor, and which has simple structure. The liquid supply unit includes a first nozzle, a second nozzle, a motor, and a first belt. The first nozzle includes a first supply pipe for supplying a liquid, a first rotation part provided at a bottom part of the first supply pipe, and a first electromagnetic clutch provided at a bottom part of the first rotation part. The second nozzle includes a second supply pipe for supplying a liquid, a second rotation part provided at a bottom part of the second supply pipe, and a second electromagnetic clutch provided at a bottom part of the second rotation part. The motor provides a rotation force to the first electromagnetic clutch. The first belt which interlocks a rotation of the first electromagnetic clutch and the second electromagnetic clutch.

21 Claims, 5 Drawing Sheets

(51) Int. Cl.
    *F16D 27/00*      (2006.01)
    *H10P 72/00*     (2026.01)

(56)                References Cited

U.S. PATENT DOCUMENTS

2010/0247761 A1 *    9/2010   Hashimoto ....... H01L 21/68792
                                                             118/52
2024/0216939 A1 *    7/2024   Kim .................... H01L 21/6708

FOREIGN PATENT DOCUMENTS

KR           100895322 B1 *   5/2009    ....... H01L 21/68714
KR    10-2010-0000292 A     1/2010
KR           101121194 B1 *   3/2012    ....... H01L 21/67051

OTHER PUBLICATIONS

Machine Generated English Translation of the claims of KR 20100000292 held to Kim Kyung Hee. (Year: 2010).*
Machine Generated English Translation of the description JPH08257466 held to Yamamoto Koichi et al. (Year: 1996).*
Machine Generated English Translation of the claim JPH08257466 held to Yamamoto Koichi et al. (Year: 1996).*

\* cited by examiner

FIG. 2

LIQUID SUPPLY UNIT AND SUBSTRATE TREATING APPARATUS

CROSS-REFERENCE TO RELATED APPLICATIONS

A claim for priority under 35 U.S.C. § 119 is made to Korean Patent Application No. 10-2022-0188491 filed on Dec. 29, 2022, in the Korean Intellectual Property Office, the entire contents of which are hereby incorporated by reference.

TECHNICAL FIELD

Embodiments of the inventive concept described herein relate to a liquid supply unit and a substrate treating apparatus including the same for supplying (or spraying) a liquid to a substrate.

BACKGROUND

A conventional substrate treating apparatus and the like used in a semiconductor process (e.g., a cleaning process, a photolithography process, an etching process, etc.) have a liquid treating chamber for a liquid treatment of a substrate. In addition, the liquid treating chamber is provided with a liquid supply unit consisting of a plurality of nozzles.

Korean Patent Publication No. 10-2008-0082152 (published on Sep. 11, 2008) contains an embodiment of a liquid supply unit (referring to an assembly consisting of a spray nozzle 210, a spray nozzle driving unit 220, and a rotary motor driving unit 230 in FIG. 1 above).

On the other hand, the liquid supply unit published in the above publication cannot be used in some chambers with a low height because a plurality of spray nozzles are positioned vertically and have a long height.

SUMMARY

Embodiments of the inventive concept provide a liquid supply unit and a substrate treating apparatus including the same having a simple structure, in which a rotation of a plurality of nozzles are implemented by a single motor.

The inventive concept provides a liquid supply unit. The liquid supply unit includes a first nozzle including a first supply pipe for supplying a liquid, a first rotation part provided at a bottom part of the first supply pipe, and a first electromagnetic clutch provided at a bottom part of the first rotation part; a second nozzle including a second supply pipe for supplying a liquid, a second rotation part provided at a bottom part of the second supply pipe, and a second electromagnetic clutch provided at a bottom part of the second rotation part; a motor providing a rotation force to the first electromagnetic clutch; and a first belt which interlocks a rotation of the first electromagnetic clutch and the second electromagnetic clutch.

In an embodiment, the first rotation part includes: an upper bearing; a lower bearing positioned apart from a bottom part of the upper bearing; a guide having an upper part coupled to an inner ring of the upper bearing, and having a lower part coupled to an inner ring of the lower bearing; and a bar having an upper part coupled to an outer ring of the upper bearing, and having a lower part coupled to an outer ring of the lower bearing.

In an embodiment, the second rotation part includes: an upper bearing; a lower bearing positioned apart from a bottom part of the upper bearing; a guide having an upper part coupled to an inner ring of the upper bearing, and having a lower part coupled to an inner ring of the lower bearing; and a bar having an upper part coupled to an outer ring of the upper bearing, and having a lower part coupled to an outer ring of the lower bearing.

In an embodiment, a first pulley is provided at a bottom part of the first electromagnetic clutch, a second pulley is provided at a bottom part of the second electromagnetic clutch, and the first belt is coupled to the first pulley and the second pulley, and the motor is coupled to the first pulley.

In an embodiment, the liquid supply unit further including: a third nozzle including a third supply pipe for supplying a liquid, a third rotation part provided at a bottom part of the third supply pipe, and a third electromagnetic clutch provided at a bottom part of the third rotation part; and a second belt which interlocks a rotation of the first electromagnetic clutch and the third electromagnetic clutch.

In an embodiment, a third pulley is provided at a bottom part of the third electromagnetic clutch, and the second belt is coupled to the first pulley and the third pulley.

In an embodiment, the third rotation part includes: an upper bearing; a lower bearing positioned apart from a bottom part of the upper bearing; a guide having an upper part coupled to an inner ring of the upper bearing, and having a lower part coupled to an inner ring of the lower bearing; and a bar having an upper part coupled to an outer ring of the upper bearing, and having a lower part coupled to an outer ring of the lower bearing.

The inventive concept provides a substrate treating apparatus. The substrate treating apparatus includes a chamber housing providing an inner space; a support unit configured to support a substrate in the inner space; and a liquid supply unit configured to supply a liquid to a substrate supported on the support unit, and wherein the liquid supply unit includes: a first nozzle including a first supply pipe for supplying a liquid, a first rotation part provided at a bottom part of the first supply pipe, and a first electromagnetic clutch provided at a bottom part of the first rotation part; a second nozzle including a second supply pipe for supplying a liquid, a second rotation part provided at a bottom part of the second supply pipe, and a second electromagnetic clutch provided at a bottom part of the second rotation part; a motor providing a rotation force to the first electromagnetic clutch; and a first belt which interlocks a rotation of the first electromagnetic clutch and the second electromagnetic clutch.

In an embodiment, the first rotation part includes: an upper bearing; a lower bearing positioned apart from a lower part of the upper bearing; a guide having an upper part coupled to an inner ring of the upper bearing, and having a lower part coupled to an inner ring of the lower bearing; and a bar having an upper part coupled to an outer ring of the upper bearing, and having a lower part coupled to an outer ring of the lower bearing.

In an embodiment, the second rotation part includes: an upper bearing; a lower bearing positioned apart from a lower part of the upper bearing; a guide having an upper part coupled to an inner ring of the upper bearing, and having a lower part coupled to an inner ring of the lower bearing; and a bar having an upper part coupled to an outer ring of the upper bearing, and having a lower part coupled to an outer ring of the lower bearing.

In an embodiment, a first pulley is provided at a bottom part of the first electromagnetic clutch, a second pulley is provided at a bottom part of the second electromagnetic clutch, and the first belt is coupled to the first pulley and the second pulley, and the motor is coupled to the first pulley.

In an embodiment, the substrate treating apparatus further includes: a third nozzle including a third supply pipe for supplying a liquid, a third rotation part provided at a bottom part of the third supply pipe, and a third electromagnetic clutch provided at a bottom part of the third rotation part; and a second belt which interlocks a rotation of the first electromagnetic clutch and the third electromagnetic clutch.

In an embodiment, a third pulley is provided at a bottom part of the third electromagnetic clutch, and the second belt is coupled to the first pulley and the third pulley.

In an embodiment, the third rotation part includes: an upper bearing; a lower bearing positioned apart from a lower part of the upper bearing; a guide having an upper part coupled to an inner ring of the upper bearing, and having a lower part coupled to an inner ring of the lower bearing; and a bar having an upper part coupled to an outer ring of the upper bearing, and having a lower part coupled to an outer ring of the lower bearing.

The inventive concept provides a substrate treating apparatus. The substrate treating apparatus includes a chamber housing providing an inner space; a support unit configured to support a substrate in the inner space; and a liquid supply unit configured to supply a liquid to a substrate supported on the support unit, and wherein the liquid supply unit includes: a first nozzle including a first supply pipe for supplying a liquid, a first rotation part provided at a bottom part of the first supply pipe, and a first electromagnetic clutch provided at a bottom part of the first rotation part; a second nozzle including a second supply pipe for supplying a liquid, a second rotation part provided at a bottom part of the second supply pipe, and a second electromagnetic clutch provided at a bottom part of the second rotation part; a third nozzle including a third supply pipe for supplying a liquid, a third rotation part provided at a bottom part of the third supply pipe, and a third electromagnetic clutch provided at a bottom part of the third rotation part; a motor providing a rotation force to the first electromagnetic clutch; a first belt which interlocks a rotation of the first electromagnetic clutch and the second electromagnetic clutch; and a second belt which interlocks a rotation of the first electromagnetic clutch and the third electromagnetic clutch.

In an embodiment, a first pulley is provided at a bottom part of the first electromagnetic clutch, a second pulley is provided at a bottom part of the second electromagnetic clutch, and the first belt is coupled to the first pulley and the second pulley, and the motor is coupled to the first pulley.

In an embodiment, a third pulley is provided at a bottom part of the third electromagnetic clutch, and the second belt is coupled to the first pulley and the third pulley.

In an embodiment, the first rotation part, the second rotation part, and the third rotation part each include: an upper bearing; a lower bearing positioned apart from a lower part of the upper bearing; a guide having an upper part coupled to an inner ring of the upper bearing, and having a lower part coupled to an inner ring of the lower bearing; and a bar having an upper part coupled to an outer ring of the upper bearing, and having a lower part coupled to an outer ring of the lower bearing.

In an embodiment, the substrate treating apparatus further includes: a bracket having a first leg portion coupled to a guide of the first rotation part, a second leg portion coupled to a guide of the second rotation part, and a third leg portion coupled to a guide of the third rotation part at a front surface thereof; and an actuator provided at the bracket and moving a position of the first nozzle in a vertical direction with respect to the bracket.

In an embodiment, the first leg portion, the second leg portion, and the third leg portion are provided as a ball spline or a ball bush.

According to an embodiment of the inventive concept, a liquid supply unit may implement a rotation of a plurality of nozzles by a single motor, and a structure may be simple to occupy a small volume within a chamber housing.

According to an embodiment of the inventive concept, an energy efficiency of a substrate treating apparatus may be excellent.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 2 is a front cross-sectional view of a liquid treating chamber of FIG. 1.

Figure 1:
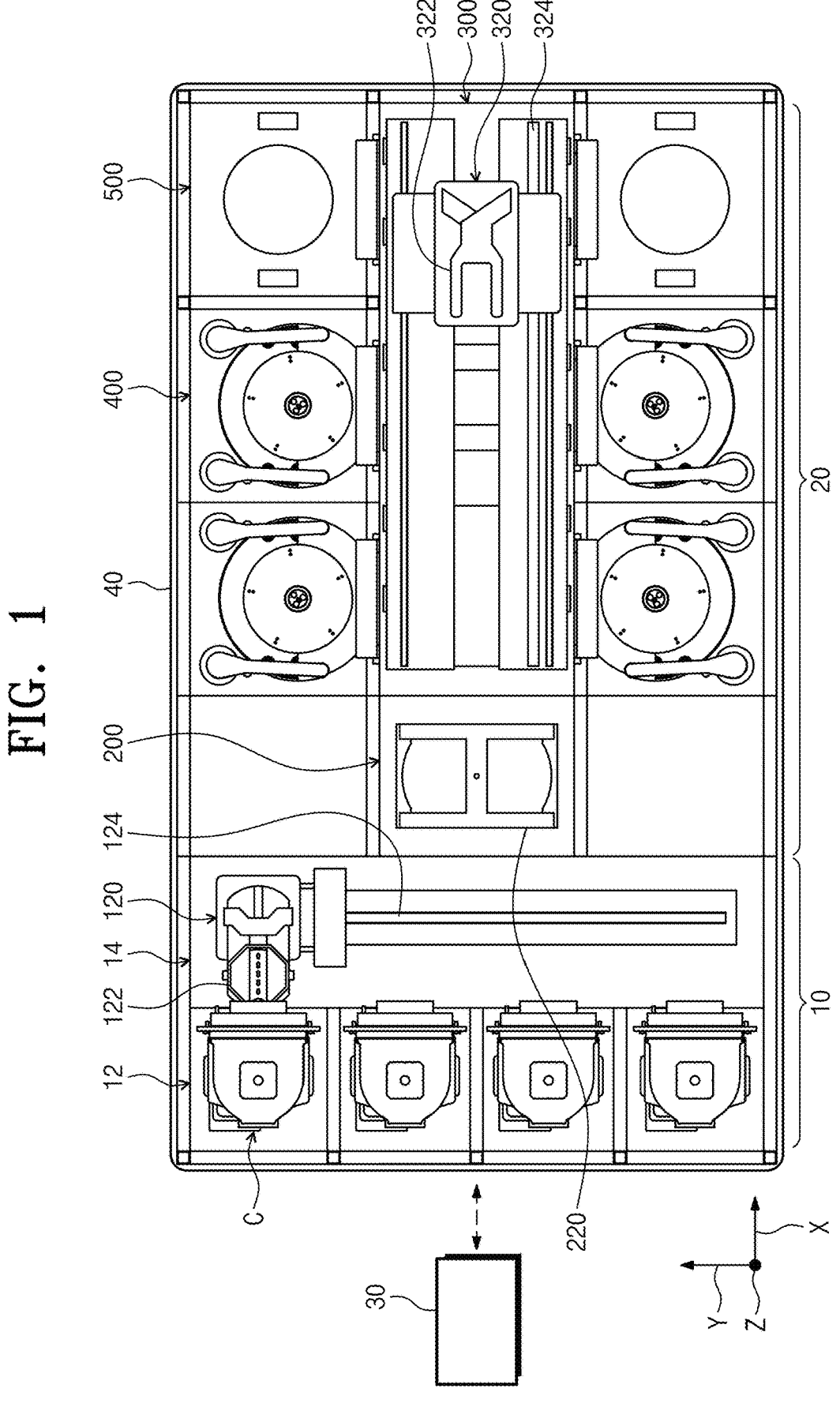
FIG. 1 is a perspective view of a substrate treating apparatus according to an embodiment.

Various features and advantages of a non-limiting embodiment of the inventive concept may be more apparent by reviewing the detailed description together with the accompanying views. The accompanying views are provided for illustrative purposes only and should not be construed as limiting the scope of claims. The accompanying views shall not be considered to be drawn to scale unless explicitly stated. For clarity, various dimensions of the views may have been exaggerated.

DETAILED DESCRIPTION

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising,", "includes", and/or "including" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "example" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Other terms such as "between", "adjacent", "near" or the like should be interpreted in the same way.

Unless otherwise defined, all terms used herein, including technical or scientific terms, have the same meaning as those generally understood by those skilled in the art to which inventive concept belongs. Terms such as those defined in commonly used dictionaries should be interpreted as consistent with the context of the relevant technology and not as ideal or excessively formal unless clearly defined in this application.

Figure 2:
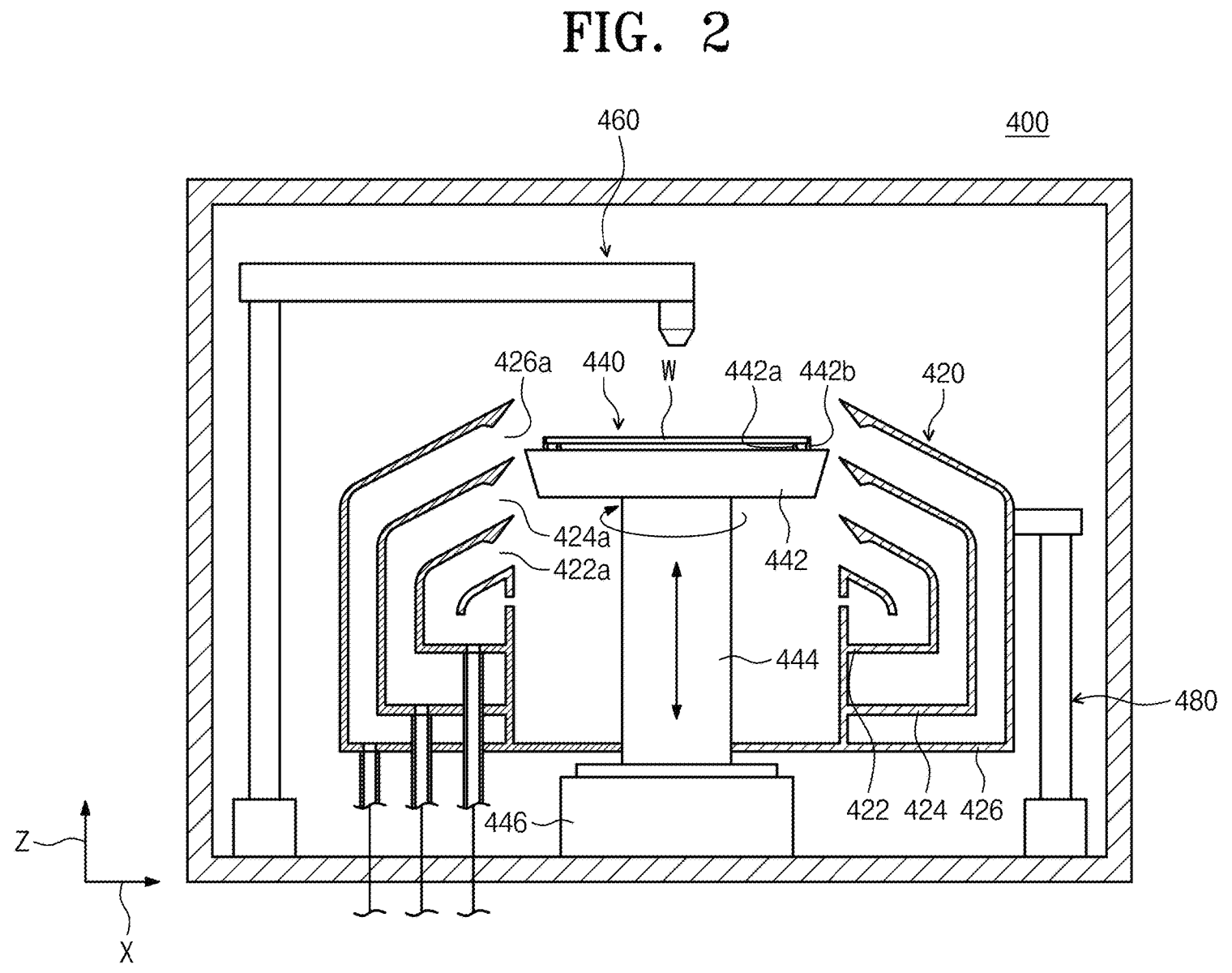

FIG. 1 is a perspective view of a substrate treating apparatus according to an embodiment, and FIG. 2 is a front cross-sectional view of a liquid treating chamber of FIG. 1.

Referring to FIG. 1 and FIG. 2, the substrate treating apparatus 1 may include an index module 10, a treating module 20, and a controller 30. The index module 10 and the treating module 20 are disposed in a direction when seen from above. A direction in which the index module 10 and the treating module 20 are disposed will be referred to as a first direction X, a direction perpendicular to the first direction X will be referred to as a second direction Y, and a direction perpendicular to both the first direction X and the second direction Y will be referred to as a third direction Z.

An entirety or a portion of the index module 10, an entirety or a portion of the treating module 20, and an entirety or a portion of the controller 30 may be positioned in an inner space of a housing 40 having a predetermined volume. The housing 40 may be provided in a metal material.

The index module 10 transfers a substrate W from a container C in which the substrate W is stored to the treating module 20, and may store a substrate W to which a treating has been completed at the treating module 20 in the container C. A lengthwise direction of the index module 10 may be provided in the second direction Y. The index module 10 may have a load port 12 and an index frame 14. The index frame 14 may be positioned between the load port 12 and the treating module 20. The container C in which the substrates W are stored is placed on the load port 12. A plurality of load ports 12 may be provided, and the plurality of load ports 12 may be disposed along the second direction Y.

For the container C, a sealed container such as a front open unified pod FOUP may be used. The container C may be placed on the load port 12 by a transfer means (not shown) such as an overhead transfer, an overhead conveyor, or an automatic guided vehicle or by an operator.

The index frame 14 may be provided with an index robot 120. In the index frame 14, a guide rail 124 with its lengthwise direction in the second direction Y may be provided, and the index robot 120 may be provided to be movable along the guide rail 124. The index robot 120 may include a hand 122 on which the substrate W is placed, and the hand 122 may be forwardly and backwardly movable, rotatable around the third direction Z, and movable along the third direction Z. A plurality of hands 122 are provided to be spaced apart in an up/down direction, and the hands 122 may be forwardly and backwardly movable independently of each other.

The controller 30 may control the substrate treating apparatus 1. The controller may include a process controller e.g., a microprocessor (computer) that executes a control of the substrate treating apparatus 1, a user interface e.g., a keyboard in which an operator performs a command input operation or the like in order to manage the substrate treating apparatus 1, a display for visualizing and displaying an operation situation of the substrate treating apparatus 1, and the like, and a storage unit storing a control program for executing the process performed in the substrate treating apparatus under the control of the process controller, a various data and a program (i.e., treatment recipe) for executing various process in each component according to treating conditions. Further, the user interface and the storage unit may be connected to the process controller. The treatment recipe may be stored in a storage medium in the storage unit, and the storage medium may be a hard disk, and may also be a portable disk, such as a CD-ROM or a DVD, or a semiconductor memory, such as a flash memory.

The controller 30 may control the substrate treating apparatus 1.

The treating module 20 may include a buffer unit 200, a transfer chamber 300, a liquid treating chamber 400, and a drying chamber 500. The buffer unit 200 provides a space in which the substrate W carried into the treating module 20 and the substrate W carried out from the treating module 20 temporarily stay. The liquid treating chamber 400 supplies a liquid onto the substrate W to perform a liquid treatment process of liquid treating the substrate W. The drying chamber 500 performs a drying process of removing a liquid remaining on the substrate W. The transfer chamber 300 transfers the substrate W between the buffer unit 200, the liquid treating chamber 400, and the drying chamber 500.

A lengthwise direction of the transfer chamber 300 may be provided in the first direction X. The buffer unit 200 may be disposed between the index module 10 and the transfer chamber 300. The liquid treating chamber 400 and the drying chamber 500 may be disposed on a side of the transfer chamber 300. The liquid treating chamber 400 and the transfer chamber 300 may be disposed along the second direction Y. The drying chamber 500 and the transfer chamber 300 may be disposed along the second direction Y. The buffer unit 200 may be positioned at an end of the transfer chamber 300.

The liquid treating chambers 400 may be disposed on both sides of the transfer chamber 300, the drying chambers 500 may be disposed on both sides of the transfer chamber 300, and the liquid treating chambers 400 may be disposed closer to the buffer unit 200 than the drying chambers 500. In some embodiments, at one and/or both sides of the transfer chamber 300, the liquid treating chambers 400 may be provided in an array of A×B (A and B are natural numbers greater than 1 or 1) along the first direction X and the third direction Z. In some embodiments, at one and/or both sides of the transfer chamber 300, the drying chambers 500 may be provided in an array of C×D (C and D are natural numbers greater than 1 or 1) along the first direction X and the third direction Z. In some embodiments, only liquid treating chambers 400 may be provided at one side of the transfer chamber 300, and only dry chambers 500 may be provided at the other side of the transfer chamber 300.

The transfer chamber 300 may have a transfer robot 320. In the transfer chamber 300, a guide rail 324 with its lengthwise direction provided in the first direction X may be provided, and the transfer robot 320 may be provided to be movable on the guide rail 324. The transfer robot 320 may include a hand 322 on which the substrate W is placed, and the hand 322 may be provided to be forwardly and backwardly movable, rotatable around the third direction Z as an axis, and movable along the third direction Z. A plurality of hands 322 are provided to be spaced apart in the up/down direction, and the hands 322 may be forwardly and backwardly movable independently from each other.

The buffer unit 200 includes a plurality of buffers 220 on which the substrate W is placed. The buffers 220 may be disposed to be spaced apart from each other in the third direction Z. A front face and a rear face of the buffer unit 200 are opened. The front face is a surface facing the index module 10, and the rear face is a surface facing the transfer chamber 300. The index robot 120 may access the buffer unit 200 through the front face, and the transfer robot 320 may access the buffer unit 200 through the rear face.

The liquid treating chamber 400 may include a chamber housing 410, a cup 420, a support unit 440, a liquid supply unit 460, and a lifting/lowering unit 480.

The chamber housing 410 may have an inner space in which the substrate W is treated. The chamber housing 410 may have a generally hexahedral shape. For example, the chamber housing 410 may have a rectangular parallelepiped shape. In addition, an opening (not shown) through which the substrate W is taken in or taken out may be formed in the chamber housing 410. In addition, a door (not shown) for selectively opening and closing the opening may be installed at the chamber housing 410.

The cup 420 may have a container shape with an open top. The cup 420 may have a treating space, and the substrate W may be liquid-treated in the treating space. The support unit 440 supports the substrate W in the treating space. The liquid supply unit 460 supplies the treating liquid onto the substrate W supported by the support unit 440. The treating liquid may be provided in a plurality of types and may be sequentially supplied onto the substrate W. The lifting/lowering unit 480 adjusts a relative height between the cup 420 and the support unit 440.

In an embodiment, the cup 420 may have a plurality of recollecting containers 422, 424, and 426. Each of the recollecting containers 422, 424, and 426 may have a recollecting space for recollecting the liquid used for substrate treatment. Each of the recollecting containers 422, 424, and 426 may be provided in a ring shape surrounding the support unit 440. During a liquid treatment process, the treating liquid scattered by a rotation of the substrate W is introduced into the recollecting space through the inlets 422a, 424a, and 426a of each respective recollecting container 422, 424, and 426.

The cup 420 may have a first recollecting container 422, a second recollecting container 424, and a third recollecting container 426. The first recollecting container 422 may be disposed to surround the support unit 440, the second recollecting container 424 may be disposed to surround the first recollecting container 422, and the third recollecting container 426 may be disposed to surround the second recollecting container 424. The second inlet 424a introducing the liquid into the second recollecting container 424 may be positioned above the first inlet 422a introducing the liquid into the first recollecting container 422, and the third inlet 426a introducing the liquid into the third recollecting container 426a may be positioned above the second inlet 424a.

The support unit 440 may have a support plate 442 and a drive shaft 444. A top surface of the support plate 442 is provided in a substantially circular shape and may have a diameter larger than that of the substrate W. A support pin 442a is provided at a central part of the support plate 442 to support a bottom surface of the substrate W, and the support pin 442a may be provided to protrude from the support plate 442 such that the substrate W is spaced apart from the support plate 442 by a predetermined distance. A chuck pin 442b is provided at an edge of the support plate 442. The chuck pin 442b is provided to upwardly protrude from the support plate 442, and supports a side of the substrate W so that the substrate W is stably held by the support unit 440 when the substrate W is rotated. The drive shaft 444 is driven by the driver 446, is connected to the center of the bottom surface of the substrate W, and rotates the support plate 442 based on its central axis.

Figure 3:
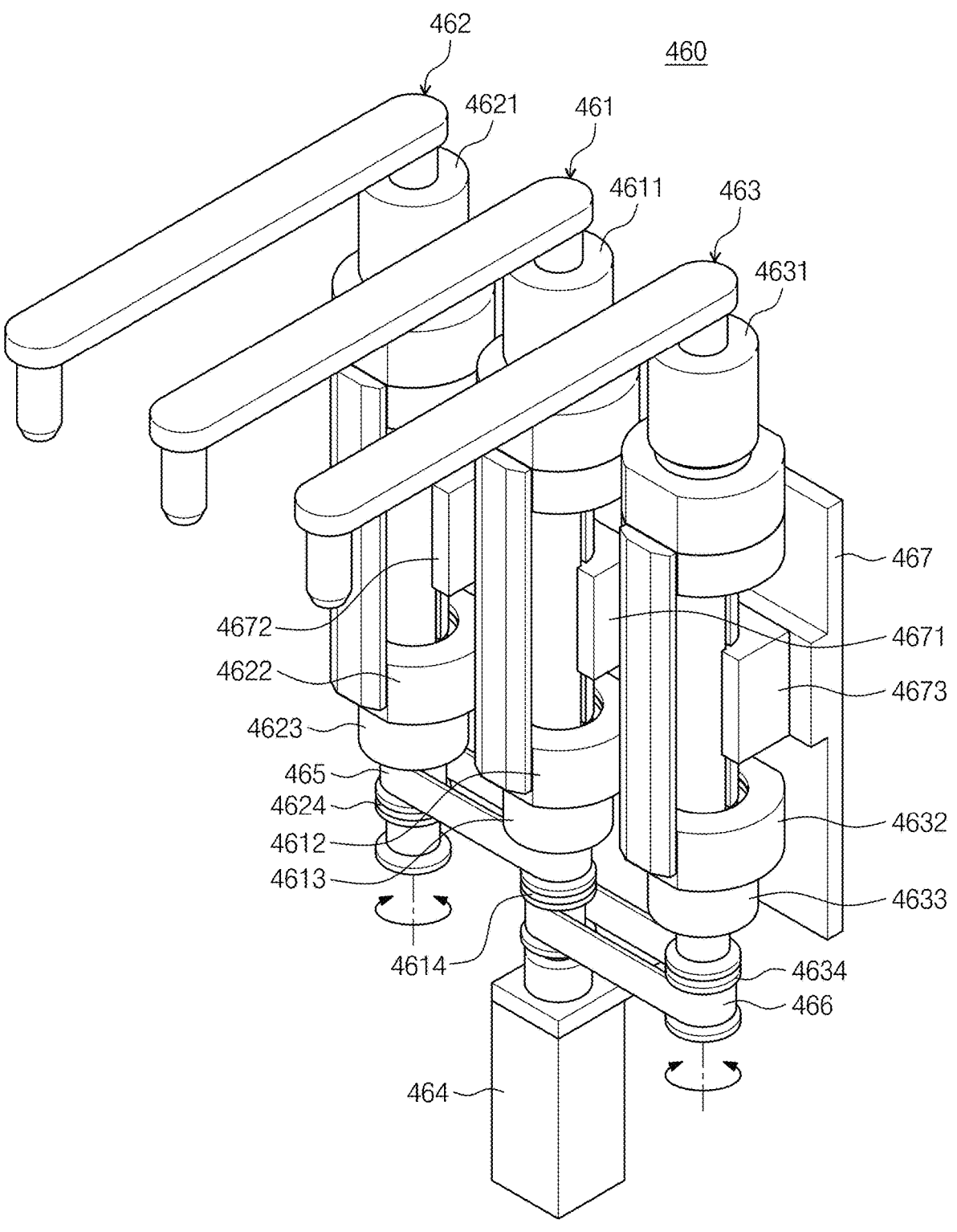
FIG. 3 and FIG. 4 are perspective views of a liquid supply unit according to an embodiment.
Figure 4:
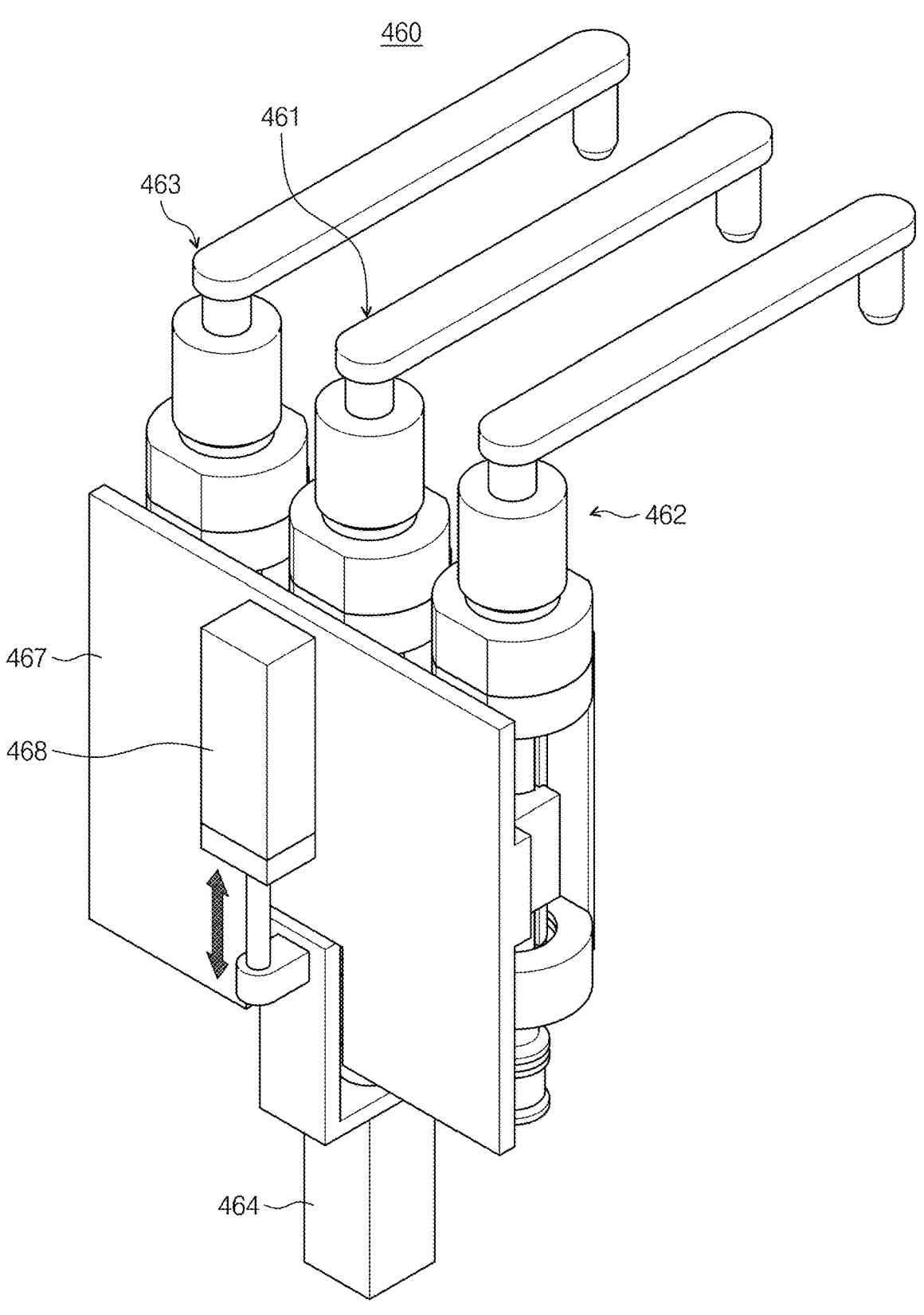
Figure 5:
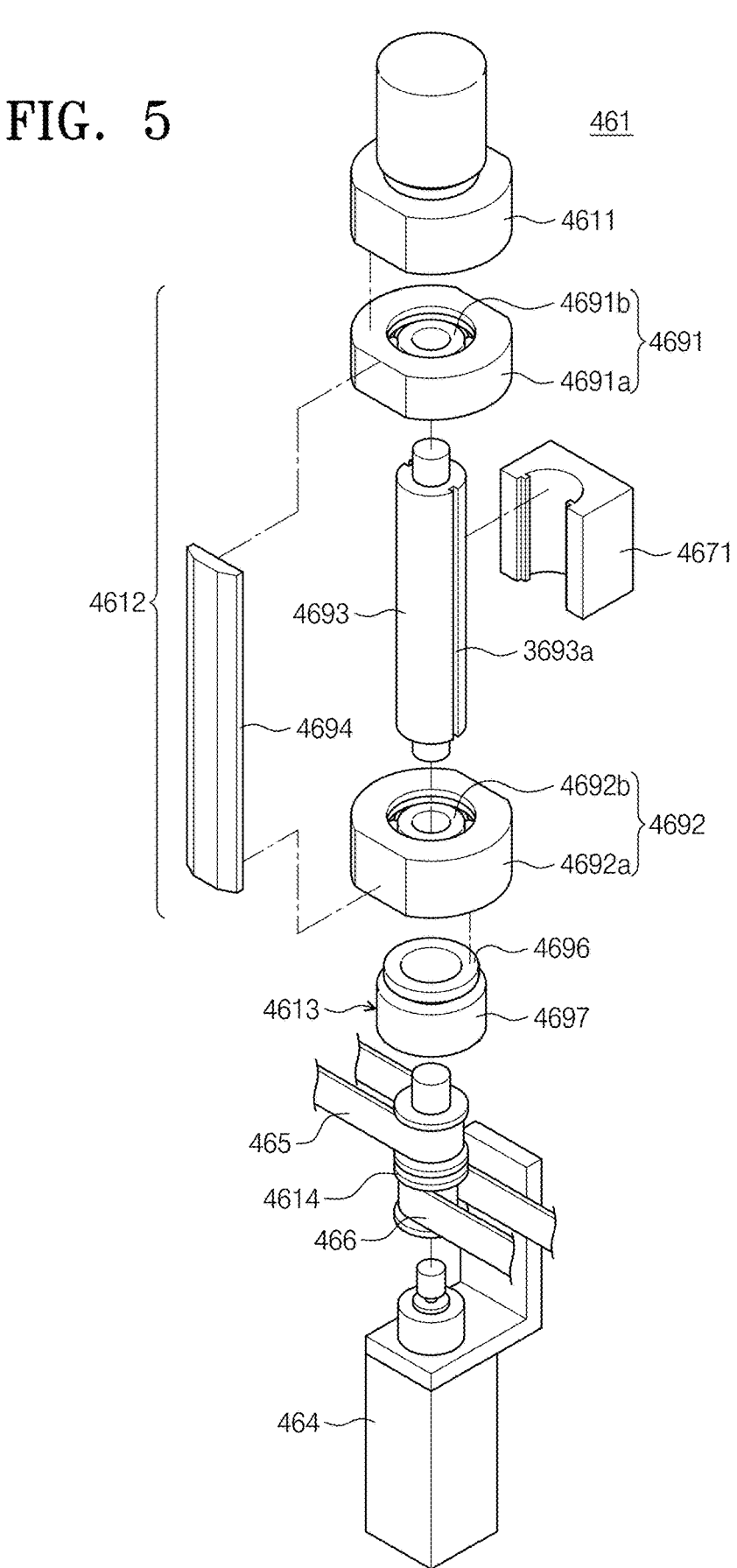
FIG. 5 is an exploded perspective view of a first nozzle of FIG. 3.

FIG. 3 and FIG. 4 are perspective views of a liquid supply unit according to an embodiment, and FIG. 5 is an exploded perspective view of a first nozzle of FIG. 3.

As shown in FIG. 3 to FIG. 5, the liquid supply unit 460 in accordance with the embodiment has at least one nozzle 461, 462 and 463. The nozzles 461, 462, and 463 may supply a treating liquid to the substrate W. The treating liquid may be a chemical, a rinsing liquid, an organic solvent, or the like. The chemical may have strong acid or strong base properties. The rinsing liquid may also be a pure water. The organic solvent may be an isopropyl alcohol (IPA).

The liquid supply unit 460 may include three nozzles 461, 462, and 463, a motor 464, a first belt 465, and a second belt 466. The three nozzles 461, 462, and 463 are defined as a first nozzle 461, a second nozzle 462, and a third nozzle 463, respectively.

The first to third nozzles 461, 462, and 463 may be disposed in a horizontal direction.

The first nozzle 461 includes a first supply pipe 4611 for supplying a liquid, a first rotation part 4612 provided below the first supply pipe 4611, and a first electromagnetic clutch 4613 provided under the first rotation part 4612.

The first electromagnetic clutch 4613 may include a first portion 4696 and a second portion 4697. An electromagnet (not shown) is provided in any one of the first portion 4696 and the second portion 4697. If the electromagnet is operated, the first portion 4696 and the second portion 4697 are in close contact with each other in a vertical direction so that a power of the second portion 4697 is directly transmitted to the first portion 4696, and this state is defined as an ON state of the first electromagnetic clutch 4613. Also, if a gap is formed between the first portion 4696 and the second portion 4697 so that the power of the second portion 4697 is not transmitted to the first portion 4696, this state is defined as an OFF state of the first electromagnetic clutch 4613.

The first electromagnetic clutch 4613 is not limited to a specific shape, and as an example, the first portion 4696 may be provided in the form of a disk having an axis formed in a center of the bottom surface, and the second portion 4697 may be provided in the form of a wheel coupled to the axis of the first portion 4696. Various commercially known structures may be adopted as the first electromagnetic clutch 4613.

The first rotation part 4612 may include a upper bearing 4691, a lower bearing 4692, a guide 4693, and a bar 4694.

The upper bearing 4691 and the lower bearing 4692 are vertically spaced apart from each other. The upper bearing 4691 and the lower bearing 4692 may have the same standard.

An outer ring 4691*a* of the upper bearing 4691 is coupled to the first supply pipe 4611. That is, if the outer ring 4691*a* of the upper bearing 4691 is rotated, the first supply pipe 4611 is also rotated.

The outer ring 4692*a* of the lower bearing 4692 is coupled to the first portion 4696 of the first electromagnetic clutch 4613.

A top end of the guide 4693 is coupled to an inner ring 4691*b* of the upper bearing 4691, and a bottom end thereof is coupled to an inner ring 4692*b* of the lower bearing 4692. The guide 4693 may be fixedly installed on a wall surface of the chamber housing 410 or a bracket 467 to be described later. A rail groove 4693*a* coupled to a first leg portion 4671 to be described later may be formed in the guide 4693.

A top part of the bar 4694 is coupled to an outer ring 4691*a* of the upper bearing 4691, and a bottom part thereof is coupled to an outer ring 4692*a* of the lower bearing 4692. The bar 4694 interconnects a rotation of the outer ring 4691*a* of the upper bearing 4691 and the outer ring 4692*a* of the lower bearing 4692. That is, if the first electromagnetic clutch 4613 is turned on while the guide 4693 is fixed to the bracket 467, and a rotational force of the first electromagnetic clutch 4613 is transmitted to the outer ring 4692*a* of the lower bearing 4692, the outer ring 4691*a* and the first supply pipe 4611 are also rotated by the bar 4694.

The second nozzle 462 includes a second supply pipe 4621 for supplying a liquid, a second rotation part 4622 provided under the second supply pipe 4621, and a second electromagnetic clutch 4623 provided below the second rotation part 4622. The second rotation part 4622 may be provided in the same structure as the first rotation part 4612. The second electromagnetic clutch 4623 may be provided in the same structure as the first electromagnetic clutch 4613.

The third nozzle 463 includes a third supply pipe 4631 for supplying a liquid, a third rotation part 4632 provided under the third supply pipe 4631, and a third electromagnetic clutch 4633 provided below the third rotation part 4632. The third rotation part 4632 may be provided in the same structure as the first rotation part 4612. The third electromagnetic clutch 4633 may be provided in the same structure as the first electromagnetic clutch 4613.

A first pulley 4614 may be provided under the first electromagnetic clutch 4613. A second pulley 4624 may be provided under the second electromagnetic clutch 4623. A third pulley 4634 may be provided under the third electromagnetic clutch 4633. The first pulley 4614 may have two belt accommodating grooves.

The first belt 465 is coupled to the first pulley 4614 and the second pulley 4624 to interlock a rotation of the first electromagnetic clutch 4613 and the second electromagnetic clutch 4623.

The second belt 466 is coupled to the first pulley 4614 and the third pulley 4634 to interlock a rotation of the first electromagnetic clutch 4613 and the third electromagnetic clutch 4633.

The motor 464 is coupled to a bottom portion of the first pulley 4614 to provide a rotational force to the first electromagnetic clutch 4613.

An operation of the liquid supply unit 460 will be described. If the motor 464 rotates, if the first electromagnetic clutch 4613 is in the ON state and the second electromagnetic clutch 4623 and the third electromagnetic clutch 4633 are in the OFF state, a power is transmitted to the first rotation part 4612 to rotate the first supply pipe 4611. Similarly, if the second electromagnetic clutch 4623 is in the ON state and the first electromagnetic clutch 4613 and the third electromagnetic clutch 4633 are in the OFF state, a power is transmitted to the second rotation part 4622 to rotate the second supply pipe 4621, and if the third electromagnetic clutch 4633 is in the ON state and first electromagnetic clutch 4613 and the second electromagnetic clutch 4623 are in the OFF state, a power is transmitted to the third rotation part 4632 to rotate the third supply pipe 4631.

In some embodiments, the liquid supply unit 460 may further include a bracket 467 and an actuator 468.

A first leg portion 4671, a second leg portion 4672, and a third leg portion 4673 may be provided on a front surface of the bracket 467. The first leg portion 4671 is coupled to the guide 4693 of the first rotation part 4612. The second leg portion 4672 is coupled to the guide of the second rotation part 4622. The third leg portion 4673 is coupled to the guide of the third rotation part 4632. Each of the first leg portion 4671, the second leg portion 4672, and the third leg portion 4673 may be provided as a ball spline or a ball bush.

The actuator 468 may be coupled to a rear surface of the bracket 467. A rod of the actuator 468 may be coupled to a body of the motor 464. The actuator 468 moves the first nozzle 461 in the vertical direction with respect to the bracket 467. The second nozzle 462 and the third nozzle 463 may become a set with the first nozzle 461 and may be configured to move in the vertical direction together with the first nozzle 461.

In some embodiments, the first to third nozzles 461, 462, and 463 may supply different types of treating liquids. For example, any one of the first to third nozzles 461, 462, and 463 may supply a chemical, another of the first to third nozzles 461, 462, and 463 may supply a rinsing liquid, and another of the first to third nozzles 461, 462, and 463 may supply an organic solvent.

The controller 30 may control the liquid supply unit 460 to supply the organic solvent from another one of the first to third nozzles 461, 462, and 463 to the substrate W, after supplying a rinsing liquid to the substrate from another one of the first to third nozzles 461, 462, and 463. Accordingly, the rinsing liquid supplied onto the substrate W may be replaced with an organic solvent having a small surface tension.

The liquid supply unit 460 is configured to rotate (=swing) a plurality of nozzles 461, 462, and 463 by a single motor 464, and its structure is simple and thus takes up a small volume in the chamber housing 410.

Referring back to FIG. 1 to FIG. 2, the lifting/lowering unit 480 moves the cup 420 in the vertical direction. A relative height between the cup 420 and the substrate W is changed by a vertical movement of the cup 420. Accordingly, since the recollecting containers 422, 424 and 426 for recollecting the treating liquid are changed according to the type of liquid supplied to the substrate W, the liquids may be separately recollected. Unlike the above description, the cup 420 may be fixedly installed, and the lifting/lowering unit 480 may move the support unit 440 in the vertical direction.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A liquid supply unit, comprising:
a first nozzle including a first supply pipe configured to supply a first liquid, a first rotation part at a bottom part of the first supply pipe, and a first electromagnetic clutch at a bottom part of the first rotation part;
a second nozzle including a second supply pipe configured to supply a second liquid, a second rotation part at a bottom part of the second supply pipe, and a second electromagnetic clutch at a bottom part of the second rotation part;
a motor configured to provide a rotation force to the first electromagnetic clutch; and
a first belt which interlocks a rotation of the first electromagnetic clutch and the second electromagnetic clutch such that the second rotation part moves with the first rotation part when the motor provides the rotation force.

2. The liquid supply unit of claim 1, wherein the first rotation part includes:
an upper bearing;
a lower bearing positioned apart from a bottom part of the upper bearing;
a guide having an upper part coupled to an inner ring of the upper bearing, and having a lower part coupled to an inner ring of the lower bearing; and
a bar having an upper part coupled to an outer ring of the upper bearing, and having a lower part coupled to an outer ring of the lower bearing.

3. The liquid supply unit of claim 1, wherein the second rotation part includes:
an upper bearing;
a lower bearing positioned apart from a bottom part of the upper bearing;
a guide having an upper part coupled to an inner ring of the upper bearing, and having a lower part coupled to an inner ring of the lower bearing; and
a bar having an upper part coupled to an outer ring of the upper bearing, and having a lower part coupled to an outer ring of the lower bearing.

4. The liquid supply unit of claim 1, wherein a first pulley is at a bottom part of the first electromagnetic clutch,
a second pulley is at a bottom part of the second electromagnetic clutch, and
the first belt is coupled to the first pulley and the second pulley, and
the motor is coupled to the first pulley.

5. The liquid supply unit of claim 4, further comprising:
a third nozzle including a third supply pipe configured to supply a third liquid, a third rotation part at a bottom part of the third supply pipe, and a third electromagnetic clutch at a bottom part of the third rotation part; and
a second belt which interlocks a rotation of the first electromagnetic clutch and the third electromagnetic clutch such that the third rotation part moves with the first rotation part when the motor provides the rotation force.

6. The liquid supply unit of claim 5, wherein a third pulley is at a bottom part of the third electromagnetic clutch, and the second belt is coupled to the first pulley and the third pulley.

7. The liquid supply unit of claim 5, wherein the third rotation part includes:
an upper bearing;
a lower bearing positioned apart from a bottom part of the upper bearing;
a guide having an upper part coupled to an inner ring of the upper bearing, and having a lower part coupled to an inner ring of the lower bearing; and
a bar having an upper part coupled to an outer ring of the upper bearing, and having a lower part coupled to an outer ring of the lower bearing.

8. The liquid supply unit of claim 1, wherein the first electromagnetic clutch and the second electromagnetic clutch are spaced apart from each other in a horizontal direction, a longitudinal length of the first supply pipe and the second supply pipe extending in a vertical direction.

9. A substrate treating apparatus, comprising:
a chamber housing defining an inner space;
a support configured to support a substrate in the inner space; and
a liquid supply configured to supply a liquid to a substrate supported on the support, and
wherein the liquid supply includes:
a first nozzle including a first supply pipe configured to supply a first liquid, a first rotation part at a bottom part of the first supply pipe, and a first electromagnetic clutch at a bottom part of the first rotation part;
a second nozzle including a second supply pipe configured to supply a second liquid, a second rotation part at a bottom part of the second supply pipe, and a second electromagnetic clutch at a bottom part of the second rotation part;
a motor configured to provide a rotation force to the first electromagnetic clutch; and
a first belt which interlocks a rotation of the first electromagnetic clutch and the second electromagnetic clutch such that the second rotation part moves with the first rotation part when the motor provides the rotation force.

10. The substrate treating apparatus of claim 9, wherein the first rotation part includes:
an upper bearing;
a lower bearing positioned apart from a lower part of the upper bearing;
a guide having an upper part coupled to an inner ring of the upper bearing, and having a lower part coupled to an inner ring of the lower bearing; and
a bar having an upper part coupled to an outer ring of the upper bearing, and having a lower part coupled to an outer ring of the lower bearing.

11. The substrate treating apparatus of claim 9, wherein the second rotation part includes:
an upper bearing;
a lower bearing positioned apart from a lower part of the upper bearing;

a guide having an upper part coupled to an inner ring of the upper bearing, and having a lower part coupled to an inner ring of the lower bearing; and a bar having an upper part coupled to an outer ring of the upper bearing, and having a lower part coupled to an outer ring of the lower bearing.

12. The substrate treating apparatus of claim 9, wherein a first pulley is provided at a bottom part of the first electromagnetic clutch, a second pulley is provided at a bottom part of the second electromagnetic clutch, and the first belt is coupled to the first pulley and the second pulley, and the motor is coupled to the first pulley.

13. The substrate treating apparatus of claim 12 further comprising:

a third nozzle including a third supply pipe for supplying a third liquid, a third rotation part at a bottom part of the third supply pipe, and a third electromagnetic clutch at a bottom part of the third rotation part; and a second belt which interlocks a rotation of the first electromagnetic clutch and the third electromagnetic clutch such that the third rotation part moves with the first rotation part when the motor provides the rotation force.

14. The substrate treating apparatus of claim 13, wherein a third pulley is provided at a bottom part of the third electromagnetic clutch, and the second belt is coupled to the first pulley and the third pulley.

15. The substrate treating apparatus of claim 13, wherein the third rotation part includes:

an upper bearing;

a lower bearing positioned apart from a lower part of the upper bearing;

a guide having an upper part coupled to an inner ring of the upper bearing, and having a lower part coupled to an inner ring of the lower bearing; and a bar having an upper part coupled to an outer ring of the upper bearing, and having a lower part coupled to an outer ring of the lower bearing.

16. A substrate treating apparatus, comprising:

a chamber housing defining an inner space;

a support configured to support a substrate in the inner space; and a liquid supply configured to supply a liquid to a substrate supported on the support, and wherein the liquid supply includes:

a first nozzle including a first supply pipe configured to supply a first liquid, a first rotation part at a bottom part of the first supply pipe, and a first electromagnetic clutch at a bottom part of the first rotation part;

a second nozzle including a second supply pipe configured to supply a second liquid, a second rotation part provided at a bottom part of the second supply pipe, and a second electromagnetic clutch at a bottom part of the second rotation part;

a third nozzle including a third supply pipe configured to supply a third liquid, a third rotation part at a bottom part of the third supply pipe, and a third electromagnetic clutch at a bottom part of the third rotation part;

a motor configured to provide a rotation force to the first electromagnetic clutch;

a first belt which interlocks a rotation of the first electromagnetic clutch and the second electromagnetic clutch such that the second rotation part moves with the first rotation part when the motor provides the rotation force; and a second belt which interlocks a rotation of the first electromagnetic clutch and the third electromagnetic clutch such that the third rotation part moves with the first rotation part when the motor provides the rotation force.

17. The substrate treating apparatus of claim 16, wherein a first pulley is at a bottom part of the first electromagnetic clutch, a second pulley is at a bottom part of the second electromagnetic clutch, and the first belt is coupled to the first pulley and the second pulley, and the motor is coupled to the first pulley.

18. The substrate treating apparatus of claim 17, wherein a third pulley is at a bottom part of the third electromagnetic clutch, and the second belt is coupled to the first pulley and the third pulley.

19. The substrate treating apparatus of claim 16, wherein the first rotation part, the second rotation part, and the third rotation part each include:

an upper bearing;

a lower bearing positioned apart from a lower part of the upper bearing;

a guide having an upper part coupled to an inner ring of the upper bearing, and having a lower part coupled to an inner ring of the lower bearing; and a bar having an upper part coupled to an outer ring of the upper bearing, and having a lower part coupled to an outer ring of the lower bearing.

20. The substrate treating apparatus of claim 19, further comprising:

a bracket having a first leg portion coupled to a guide of the first rotation part, a second leg portion coupled to a guide of the second rotation part, and a third leg portion coupled to a guide of the third rotation part at a front surface thereof; and an actuator at the bracket, the actuator being configured to move a position of the first nozzle in a vertical direction with respect to the bracket.

21. The substrate treating apparatus of claim 20, wherein the first leg portion, the second leg portion, and the third leg portion are provided as a ball spline or a ball bush.

* * * * *